July 27, 1965 R. C. INGRAHAM 3,197,608

METHOD OF MANUFACTURE OF SEMICONDUCTOR DEVICES

Filed Jan. 23, 1962

2 Sheets-Sheet 1

INVENTOR.
ROBERT C. INGRAHAM

BY

David M. Keay

AGENT.

METHOD OF MANUFACTURE OF SEMICONDUCTOR DEVICES

Filed Jan. 23, 1962

INVENTOR.
ROBERT C. INGRAHAM
BY
David M. Keay
AGENT.

United States Patent Office 3,197,608

Patented July 27, 1965

3,197,608

METHOD OF MANUFACTURE OF SEMICONDUCTOR DEVICES

Robert C. Ingraham, Topsfield, Mass., assignor to Sylvania Electric Products Inc., a corporation of Delaware Filed Jan. 23, 1962, Ser. No. 168,091
4 Claims. (Cl. 219—85)

Figure 1:
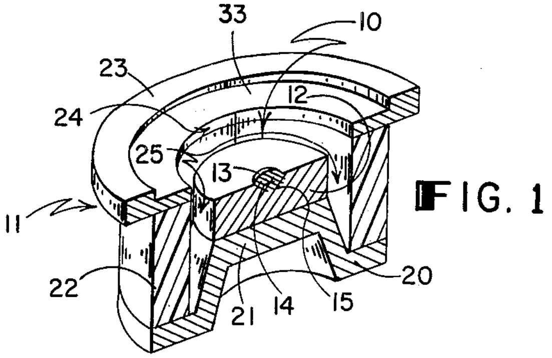

This invention relates to methods of manufacturing semiconductor devices. More particularly, it is concerned with methods of establishing electrical contact to an electrode alloyed into the surface of a body of semi-conductor material to form a rectifying junction.

An alloyed junction semiconductor device is commonly fabricated from a body of semiconductor material of one conductivity type by alloying to the body an electrode in the form of a pellet containing material capable of imparting the opposite type of conductivity to the semiconductor material. A P-N junction is formed between the bulk of the body of semiconductor material and the recrystallized zone containing conductivity type imparting material from the pellet.

One type of semiconductor device having an alloyed junction is the so-called "tunnel diode." Generally, in order to obtain the desired electrical characteristics a junction of small area is established in a tunnel diode by alloying into the surface of a semiconductor body an extremely small pellet containing the conductivity type imparting material. The electrode formed on the surface of the semiconductor body by the alloyed pellet is generally hemispherical in shape, typically on the order of 2 mils in diameter.

The electrically active elements of the device consisting of the body or wafer of semiconductor material and the alloyed electrode are mounted in an enclosure with the bulk portion of the body making ohmic contact to a conductive base plate which serves as one of the electrical terminals of the diode. In order to provide for a complete circuit to be made across the rectifying junction of the tunnel diode, means must be provided which are in electrical contact with the electrode and serve as the other electrical terminal of the diode.

Because of the extremely small size of the electrode, it is difficult to establish electrical contact to it with a relatively large conductive element. The electrode must first be located and a conductive element brought into contact with it without creating a short circuit to the bulk of the body of semiconductor material. Then, a suitable mechanical and electrical bond must be established between the larger conductive element and the electrode in a manner which does not damage the electrode or the alloyed junction and does not create a short circuit to the bulk of the body of semiconductor material.

It is the object of the present invention, therefore, to provide an improved method of manufacturing semiconductor devices.

It is a more specific object of the invention to provide an improved method of establishing electrical contact to the alloy junction electrode of a tunnel diode.

Briefly, in accordance with the objects of the invention contact is made to an electrode on a surface of a body of semiconductor material by positioning a conductive strip adjacent the electrode. A first conductive member is placed in contact with the strip adjacent one side of the electrode, and a second conductive member is placed in contact with the strip adjacent the opposite side of the electrode. Both contacts are advanced to move the portion of the strip intermediate the conductive members into contact with the electrode. Electrical current is then passed beween the first and second conductive members and through the portion of the strip intermediate the members. The flow of electrical current through the portion of the strip heats the portion sufficiently to cause it to fuse to the portion of the electrode with which it is in contact.

Figure 2:
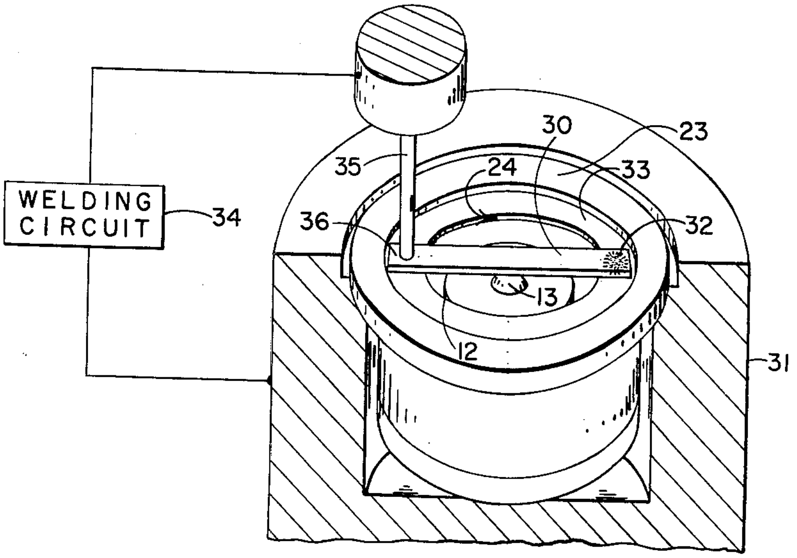
Figures 3, 4, 5:
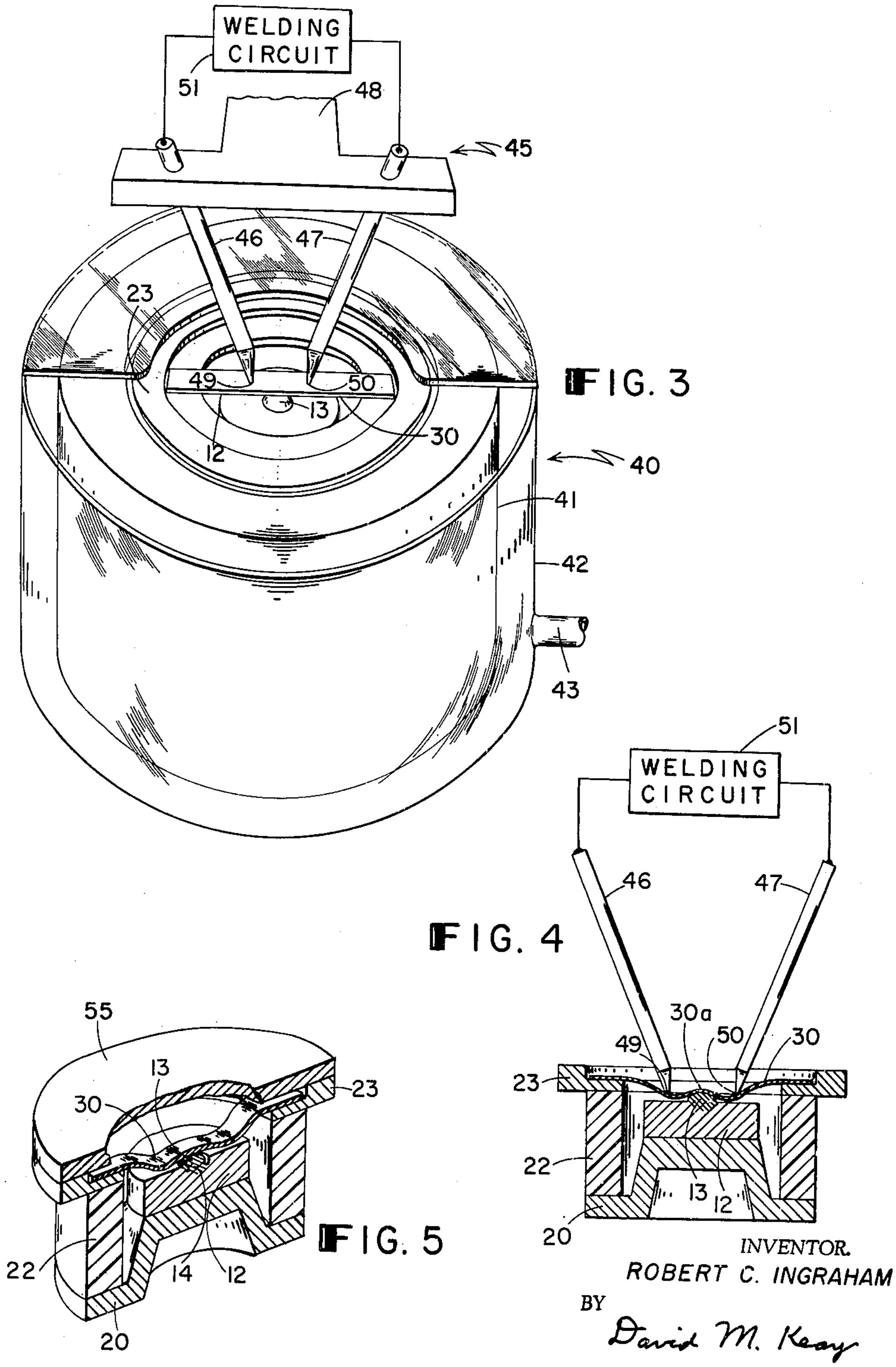

Additional objects, features, and advantages of the method of the present invention will be apparent from the following detailed discussion and the accompanying drawings wherein:

FIG. 1 is a perspective view in cross section of the electrically active elements of a tunnel diode in position in an enclosure to provide a partially completed device, FIG. 2 is a perspective view of the partially completed diode shown in FIG. 1 illustrating the manner of placing a metal strip adjacent the electrode as the strip is attached to the enclosure, FIG. 3 is a perspective view of the diode showing the metal strip fastened to the enclosure and illustrating, partially in schematic form, the apparatus for bonding the strip to the electrode.

FIG. 4 is a view in cross section illustrating the manner in which the metal strip is brought into contact with the electrode by the apparatus of FIG. 3, and FIG. 5 is a perspective view in cross section with portions broken away showing a completed tunnel diode fabricated according to the method of the invention.

In considering the accompanying drawings it will be understood that by reason of the extremely small actual size of the semiconductor devices with which the invention is concerned, it has been necessary to show certain elements of the device and certain portions of the apparatus disproportionate in size to related elements and portions in order to present a clear understanding of the invention.

The alloyed junction semiconductor device illustrated in FIG. 1 is a partially completed tunnel diode having electrically active elements 10 supported in a mounting or enclosure 11. The electrically active elements include a cylindrical body 12 of a semiconductor material of one conductivity type and an alloyed electrode 13, which contains a material capable of imparting the opposite type of conductivity to the semiconductor material, protruding from the surface of the body. Illustratively, the semiconductor body may be of P-type gallium arsenide and the electrode contain N-type conductivity imparting material. The electrode material is alloyed into the gallium arsenide body to form, upon cooling, a recrystallized region 14 of N-type gallium arsenide. This region forms with the P-type region of the bulk of the body a P-N junction 15.

The mounting 11 for the electrically active elements includes a circular metal base plate 20 having a pedestal 21 on which the semiconductor body 12 is mounted in ohmic contact. A ceramic ring 22 metallized on its upper and lower surfaces is attached to the plate and an annular metal ring or tab 23 having an opening 24 approximately equal to the inside diameter of the ceramic ring is mounted on top of the ceramic ring, thus providing a chamber 25 within the enclosure for containing the electrically active elements. The mounting plate and tab are both gold plated in order to resist the action of etching solutions.

A metal strip 30, as of pure gold foil, is attached to the metal tab so as to lie adjacent the electrode as illustrated in FIG. 2. First, the partially assembled diode as shown in FIG. 1 is placed in a metal holder or anvil 31. One end 32 of the strip is welded to a step 33 on the upper surface of the tab 23. Welding is accomplished in a known manner by passing electrical current, supplied by a welding circuit 34, between a welding tool 35 and the anvil while the tool presses the parts to be welded against the anvil.

The strip 30 is pulled taut across the opening 24 of the chamber of the enclosure, and then the other end 36 of the strip is welded in place on the step 33 of the tab 23 diametrically opposite the first end. The metal strip 30 thus lies across the opening of the chamber of the enclosure supported by the tab with its central section adjacent and directly over the electrode 13.

After the metal strip has been attached to the conductive tab of the enclosure, the diode is placed in an apparatus 40, illustrated somewhat schematically in FIG. 3, for the purpose of establishing electrical contact between the strip and the electrode. The apparatus includes a base or holder 41 of insulating material onto which the diode is placed. A hood 42, as of glass, surrounds the diode and holder so that forming gas introduced at an inlet 43 envelops the diode thus protecting it from oxidation during the heating operation which is performed in the apparatus.

Also included in the apparatus is a bifurcated tool 45. The tool has a first metal contact member 46 and a second metal contact member 47. The two contact members are mounted in a support 48 of insulating material with their contact edges 49 and 50 spaced apart a distance greater than the diameter of the electrode. The two members are connected to the output terminals of a capacitor-type resistance welding circuit 51 shown in block diagram form.

In carrying out the method of the invention the contact members 46 and 47 are maneuvered into position by manipulating the insulating support 48 by a suitable means (not shown) so as to straddle the electrode with the first contact member 46 adjacent the metal strip 30 on one side of the electrode and the second contact member 47 adjacent the strip on the opposite side of the electrode. This procedure may be observed through a suitable optical magnifier. The tool 45 is then lowered so that the contact edge 49 of the first member contacts the metal strip 30 adjacent the one side of the electrode 13 and the contact edge 50 of the other member contacts the strip adjacent the opposite side of the electrode. The tool is further advanced by means of a micromanipulator (not shown) toward the semiconductor body until the portion 30*a* of the strip intermediate the two contact members of the tool is moved into contact with the electrode 13. As illustrated in FIG. 4, this occurrence is readily observed through a magnifier by the appearance of a hump or bulge on the upper surface of the portion of the strip intermediate the contact members.

When contact has been made between the strip and the electrode, the tool is held in position and a pulse of electrical current from the welding circuit 51 is passed between the contact members 46 and 47. The current flows through the portion 30*a* of the strip intermediate the contact members and heats that portion. The heat melts the portion of the electrode 13 directly in contact with the strip and the molten portion alloys with the strip. Upon termination of the current pulse, the molten portion of the electrode solidifies. Thus, the electrode and the strip are mechanically and electrically connected.

Subsequent to the establishing of contact between the metal strip and the electrode the diode is chemically treated in a known manner to reduce the area of the rectifying junction as, for example, by etching according to the etching treatment disclosed and claimed in application S.N. 89,478, filed February 15, 1961, by Pierre Le Mieux for Method of Treating Semiconductor Devices and assigned to the assignee of the present invention.

In order to provide a complete tunnel diode device, a cover plate 55 as shown in FIG. 5 is placed over the opening to the chamber of the enclosure and welded to the upper rim of the tab 23 to seal the chamber of the enclosure and provide an electrical terminal. Electrical contact can then be made to the tunnel diode rectifying junction through the base plate 20 which is in direct contact with the bulk region of the body 12 of semiconductor material and through the cover plate 55 which is in contact with the recrystallized region 14 through the tab 23, the metal strip 30, and the electrode 13.

As a typical example, gallium arsenide tunnel diodes similar to the type shown in FIG. 5 were produced according to the method of the invention. Each partially completed diode as shown in FIG. 1 comprised a cylinder 12 of single crystal P-type gallium arsenide 35 mils in diameter and 10 mils thick. The gallium arsenide contained zinc as a conductivity type imparting material and was of $14 \times 10^{-4}$ ohm-centimeters resistivity. Each electrode 13 was applied to the gallium arsenide cylinders in the form of a 2 mil diameter sphere of tin. The spheres were alloyed to the cylinders at a temperature of 520° C. for a period of 30 seconds. A junction 15 was thereby formed between the electrode and the bulk of the body of gallium arsenide. After alloying, the electrode had a diameter of about 2 mils and protruded approximately 1 mil above the flat planar surface of the gallium arsenide cylinder.

Each unit of active elements 10 comprising a cylinder of gallium arsenide and its alloyed electrode was then mounted concentrically on the base plate 20 of an enclosure 11 as shown in FIG. 1. Each base plate 20 and tab 23 were of gold plated Kovar and each of the ceramic rings 22 was of alumina. The chamber of an enclosure was approximately 50 mils in diameter and 15 mils in height from the surface of the pedestal 21 to the surface of the step 33 of the tab 23.

The metal strip 30 was pure gold foil 15 mils wide and 0.3 mil thick. The gold used was in the dead soft or substantially inelastic condition so that it stretched or elongated under the stress of the contact members without breaking and maintained its elongated configuration free of strain after the contact members were retracted. Thus, in a completed device the metal strip exerted no stress on the electrode or on the rectifying junction, which was reduced to an area of approximately 0.5 mil in diameter by etching.

The contact members 46 and 47 of the tool were tungsten rods approximately 40 mils in diameter which were cut at an angle and then slightly flattened at the contact edges 49 and 50. The members were fastened in the insulating block 48 so that the contact edges were spaced apart approximately 10 mils.

The contact members were pressed against the strip at opposite sides of the electrode, and were advanced to push the strip into contact with the electrode until the electrode caused a slight bulge to be observed at the upper surface of the strip. Then, an electrical current in the form of a 0.1 watt-second pulse was discharged from the capacitance welding circuit 51 to cause the electrode and the metal strip to fuse together. The bond between the strip and the electrode was approximately 1 mil in diameter. After the diode was subjected to an etching treatment to reduce the area of the junction, a cover plate 55 of gold plated Kovar was welded to the rim of the tab 23 thus providing a completed tunnel diode as shown in FIG. 5.

What is claimed is:

1. The method of producing a semiconductor device including the steps of mounting a body of semiconductor material having an electrode on one surface thereof on a support, attaching the two end portions of a conductive strip to said support so that a central section of said strip lies adjacent the electrode, placing a first conductive member in contact with the strip adjacent one side of the electrode, placing a second conductive member in contact with the strip adjacent the opposite side of the electrode, advancing both members to cause the portion of the strip intermediate the members to contact the electrode, and passing electrical current between the first and second conductive members and through the portion of the strip intermediate the members whereby said portion is heated to cause the portion to fuse to the electrode.

2. The method of establishing contact between an electrode on a surface of a body of semiconductor material and a conductive section of an enclosure including the steps of mounting the body of semiconductor material in the enclosure, attaching the two end portions of a metal strip to a conductive section of the enclosure so that the electrode is adjacent the central section of the strip and interposed between the body of semiconductor material and the central section of the strip, placing a first conductive member in contact with the strip adjacent one side of the electrode, placing a second conductive member in contact with the strip adjacent the opposite side of the electrode, advancing said members toward the body of semiconductor material to move the portion of the strip intermediate the members into contact with the electrode, and passing electrical current between the first and second conductive members and through the portion of the strip intermediate the members whereby said portion is heated to cause the portion to fuse to the electrode.

3. The method of producing a semiconductor device including the steps of mounting a body of semiconductor material having an electrode protruding from one surface thereof in an enclosure having a chamber for receiving the body of semiconductor material, attaching the two end portions of a substantially inelastic metal strip to a conductive section of the enclosure with the central section of the strip spanning the opening to the chamber and adjacent the electrode which lies interposed between the central section of the strip and the body of semiconductor material, placing a bifurcated tool having a first metal contact member and a second metal contact member insulated from the first contact member in contact with the strip on opposite sides of the electrode, advancing said tool toward the body of semiconductor material to move the portion of the strip intermediate the contact members of the tool into contact with the electrode, passing electrical current between the two contact members of the tool and through the portion of the strip intermediate the contact members to heat said portion and cause melting of the portion of the electrode in contact with the portion of the strip, and terminating the flow of electrical current while maintaining said tool in position whereby said melted portion of the electrode solidifies and the electrode and strip are mechanically and electrically connected.

4. The method of producing a semiconductor device including the steps of mounting a body of semiconductor material having an electrode protruding from one surface thereof in an enclosure having a chamber for receiving the body of semiconductor material and a conductive member at the opening of said chamber lying above the floor of the chamber a distance greater than the thickness of the body of semiconductor material and the electrode, attaching the two end portions of a substantially inelastic metal strip to the conductive member of the enclosure on opposite sides of the opening of the chamber whereby the central section of the strip spans the chamber and the electrode lies interposed between the central section of the strip and the body of semiconductor material, placing a bifurcated tool having a first metal contact member and a second metal contact member insulated from the first member in contact with the strip on opposite sides of the electrode, advancing said tool toward the body of semiconductor material to move the portion of the strip intermediate the contact members of the tool into contact with the electrode, and passing a pulse of electrical current between the two contact members of the tool and through the portion of the strip intermediate the contact members while said tool is maintained in position to cause said portion of the strip to heat and melt the portion of the electrode in contact with the portion of the strip whereby upon termination of the pulse said melted portion of the electrode solidifies and the electrode and strip are mechanically and electrically connected.

References Cited by the Examiner

UNITED STATES PATENTS 1,818,665 8/31 Baker ---------------- 219—78

FOREIGN PATENTS 610,791 12/60 Canada.
830,390 5/38 France.
1,205,947 8/59 France.

RICHARD M. WOOD, *Primary Examiner.*